United States Patent

Schuhmacher et al.

[11] Patent Number: 5,232,572
[45] Date of Patent: Aug. 3, 1993

[54] DEVICE FOR THE RELEASABLE FASTENING OF A TARGET OR TARGET BASE ON A CATHODE MOUNTING

[75] Inventors: Manfred Schuhmacher, Alzenau; Hans Kunz, Hasselroth, both of Fed. Rep. of Germany

[73] Assignee: Leybold Aktiengesellschaft, Hanau, Fed. Rep. of Germany

[21] Appl. No.: 825,674

[22] Filed: Jan. 27, 1992

[30] Foreign Application Priority Data

Oct. 10, 1991 [DE] Fed. Rep. of Germany ....... 4133564

[51] Int. Cl.⁵ .............................................. C23C 14/34
[52] U.S. Cl. ........................... 204/298.12; 204/298.09; 204/298.19
[58] Field of Search ..................... 204/298.12, 298.09, 204/298.19

[56] References Cited

U.S. PATENT DOCUMENTS

| | | | |
|---|---|---|---|
| 4,204,936 | 5/1980 | Hartsough | 204/192.12 |
| 4,668,373 | 5/1987 | Rille et al. | 204/298.12 |
| 4,820,397 | 4/1989 | Fielder et al. | 204/298.12 |
| 4,885,075 | 12/1989 | Hillman | 204/298.09 |
| 5,032,246 | 7/1991 | Blazic et al. | 204/298.12 |
| 5,112,467 | 5/1992 | Zejda | 204/298.12 |
| 5,147,521 | 9/1992 | Belli et al. | 204/298.12 |

FOREIGN PATENT DOCUMENTS

| | | | |
|---|---|---|---|
| 3425344 | 1/1985 | Fed. Rep. of Germany | 204/298.12 |
| 3603646 | 10/1986 | Fed. Rep. of Germany | 204/298.12 |
| 2-285068 | 11/1990 | Japan | 204/298.12 |
| 2-285069 | 11/1990 | Japan | 204/298.12 |
| 2173217 | 10/1986 | United Kingdom | 204/298.12 |

Primary Examiner—Aaron Weisstuch
Attorney, Agent, or Firm—Felfe & Lynch

[57] ABSTRACT

In a device for the releasable fastening of a target (3) or target base (5) together with a magnet yoke (31) on the cathode mounting of the process chamber in a cathode sputtering apparatus, the target base (5) is provided with locking toggles (11, ...) extending perpendicular to the target plane and able to enter through openings (42, ...) in the bottom of the magnet yoke (31) and cooperating with locking levers or disks journaled on the cathode mounting or arresting device (17) in the manner of a bayonet lock or of a bascular lock and after being turned pull the target base (5) tightly onto the cathode mounting or release the locking toggles (11, ...) so that the target (3) can be removed from the cathode mounting.

7 Claims, 8 Drawing Sheets

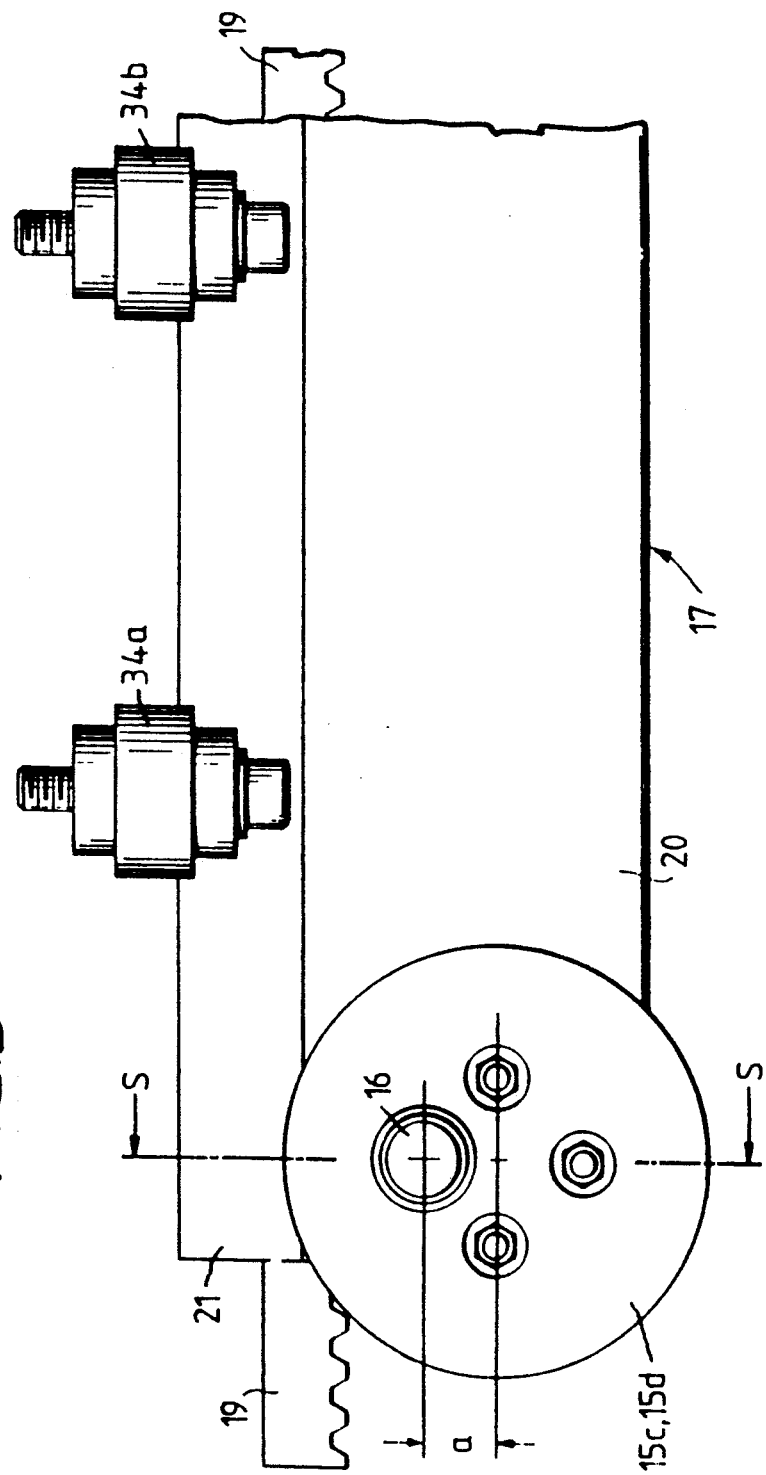

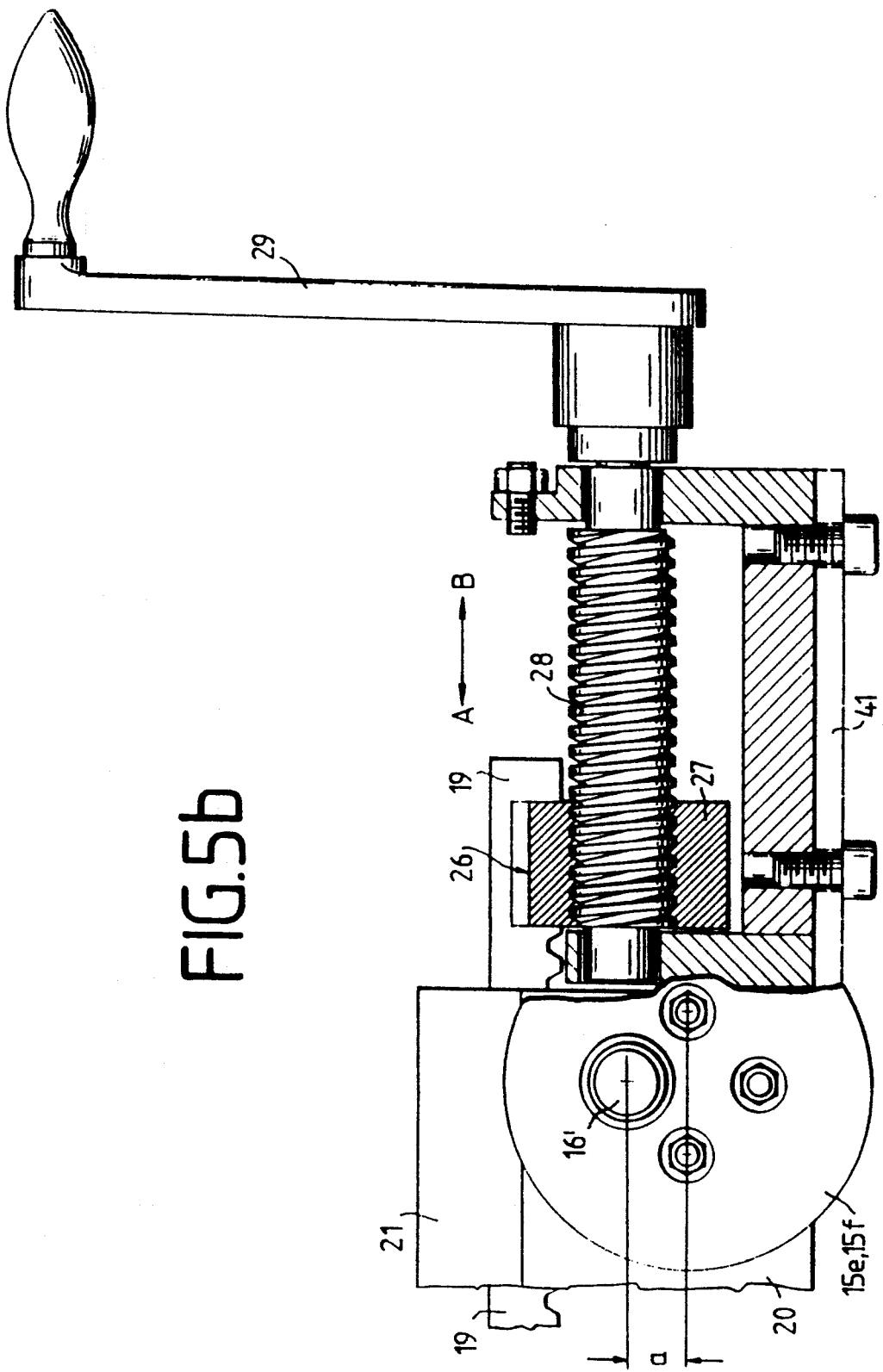

DEVICE FOR THE RELEASABLE FASTENING OF A TARGET OR TARGET BASE ON A CATHODE MOUNTING

The invention relates to a device for the releasable fastening of a target or target base on the cathode mounting of the process chamber of a cathode sputtering apparatus.

A magnetron sputter coating source for magnetic and nonmagnetic target materials is known (DE-OS 34 25 344), in which the target is held by means of claws which are bolted to the target base and grip the target at the top. This known construction has the disadvantage that the target can be changed only with the aid of a tool and the change is also extraordinarily time-consuming.

Also known is a holding device for targets for cathode sputtering (DE-OS 36 03 646) in which the targets are pressed by clips against cooling surfaces, the clips being configured such that they themselves remove at least 10% of the heat produced during the sputtering operation. This known holding device also does not permit rapid changing of the target. Lastly, it has already been proposed to provide form-fitting spring bindings, e.g., by means of a snap ring, for the mounting of targets, but neither in this case is the quick exchange of targets assured.

It is therefore an object of the present patent to construct a device of the kind defined above such that the changing of the target can be performed quickly and without any tool even at a hard-to-reach point in the process chamber. Furthermore, a height adjustment of the target is to be possible; at the same time, a cooling water connection is to be able to be provided in the middle of the target.

This is achieved in accordance with the invention in that the target base is provided with at least one locking toggle which can be introduced through openings in the bottom of the magnet yoke and cooperates with locking levers or disks in the manner of a bayonet lock or of a bascular lock and, depending on the particular position of the locking levers or disks, either draws the target base tightly onto the cathode mounting or releases the locking toggle, so that the target can be removed from the cathode mounting.

Additional details and features of the invention are given in the claims.

BRIEF DESCRIPTION OF THE DRAWINGS

The invention admits of a great variety of embodiments; one of them is represented schematically in the appended drawings, wherein.

Figure 1:
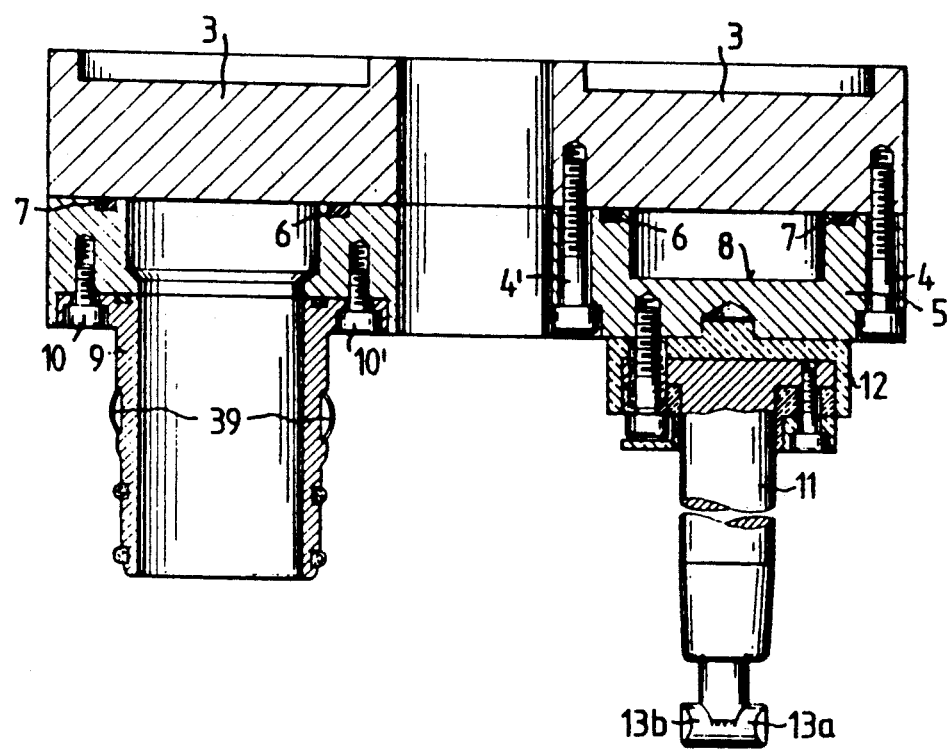
FIG. 1 is a sectional view taken transversely through a target and the target base screwed to it, with the locking toggle and coolant connection.

As FIG. 1 shows, the oval-shaped target 3 is fastened by screws 4, 4', . . . , on a likewise oval-shaped target base 5 and sealed against the target base by means of two sealing rings 6 and 7 so that coolant flowing in the cooling passage 8 cannot leak out. The cooling passage 8 is furthermore connected with a coolant connection 9 which in turn is fastened to the target base 5 by means of screws 10 and 10'.

Figure 7:
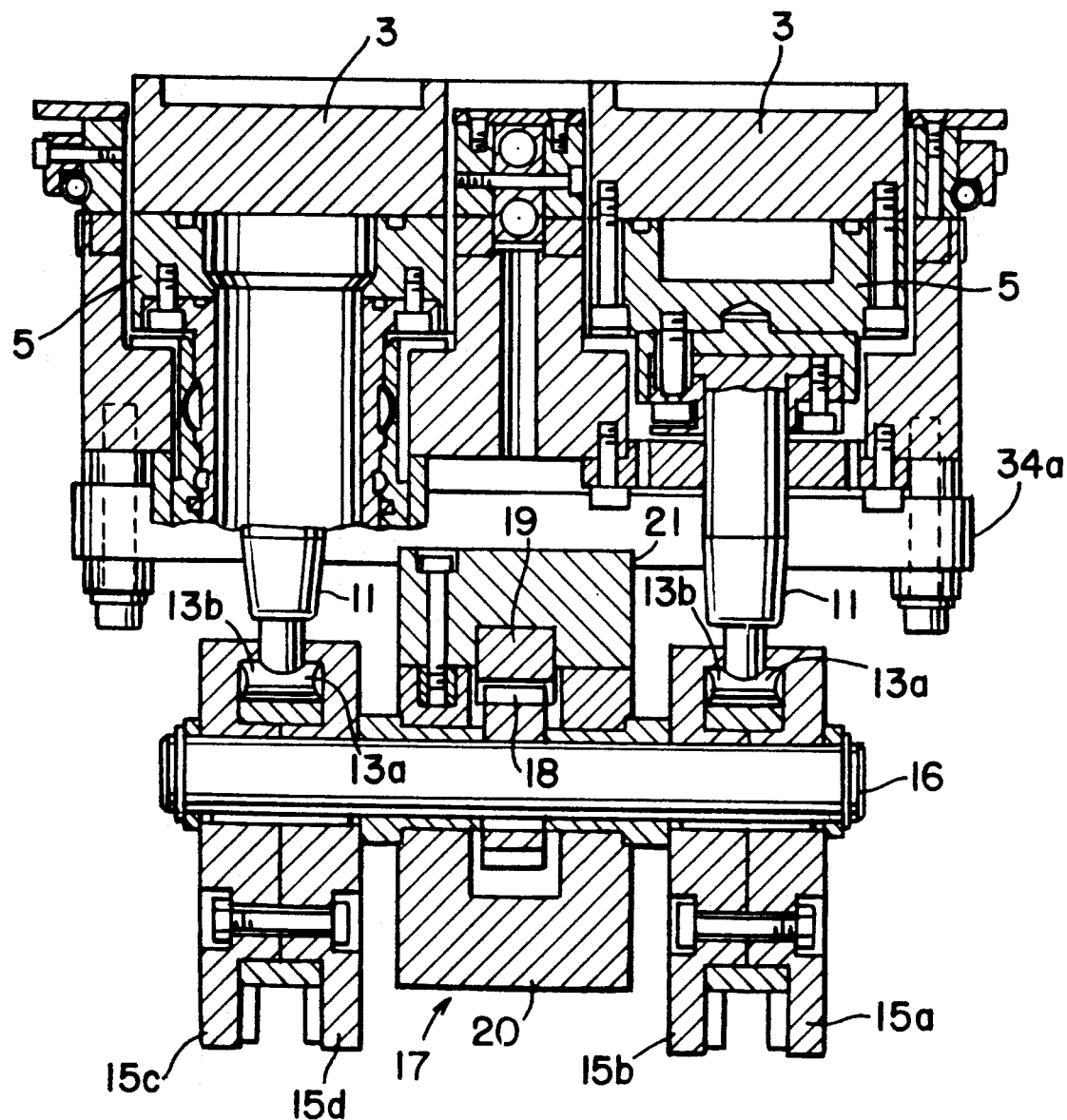
FIG. 7 is a sectional view of the target and yoke arrangement of FIG. 3 with the FIG. 4 device for arresting the toggle connected thereto.

Furthermore, the target base 5 is also screwed to two locking toggles 11 (FIG. 7) and insulating pieces 12 are disposed in each case between the locking toggle 11 and the target base 5. Each locking toggle 11 is provided at its bottom end with two locking projections 13a, 13b, which cooperate, as it can be seen in FIG. 4, with arcuate grooves 14a, 14b, or curved cam tracks which are cut into the lateral surfaces of locking disks 15a, 15b and 15c, 15d, respectively, which are mounted corotationally in pairs on locking shafts 16, 16', which in turn are mounted for longitudinal displacement on an arresting device 17 between the rails 20 and 21. The arresting device 17 is joined to a mounting 41 (see FIG. 5b) of the coating chamber of a sputtering apparatus or bolted tightly to the latter.

The upper rail 21 is provided with centering arms projecting laterally and upwardly, with centering bolts 34a, 34b, (FIG. 5a) . . . , which engage in centering bores 40 (indicated in broken lines in FIG. 2), which are disposed on the bottom of the magnet yoke 31.

The two locking shafts 16, 16' are each in working engagement through teeth 18, 18', with a rack 19 which is held and guided in grooves 22, 23, between the two rails 20, 21, of the arresting device 17.

Figure 4:
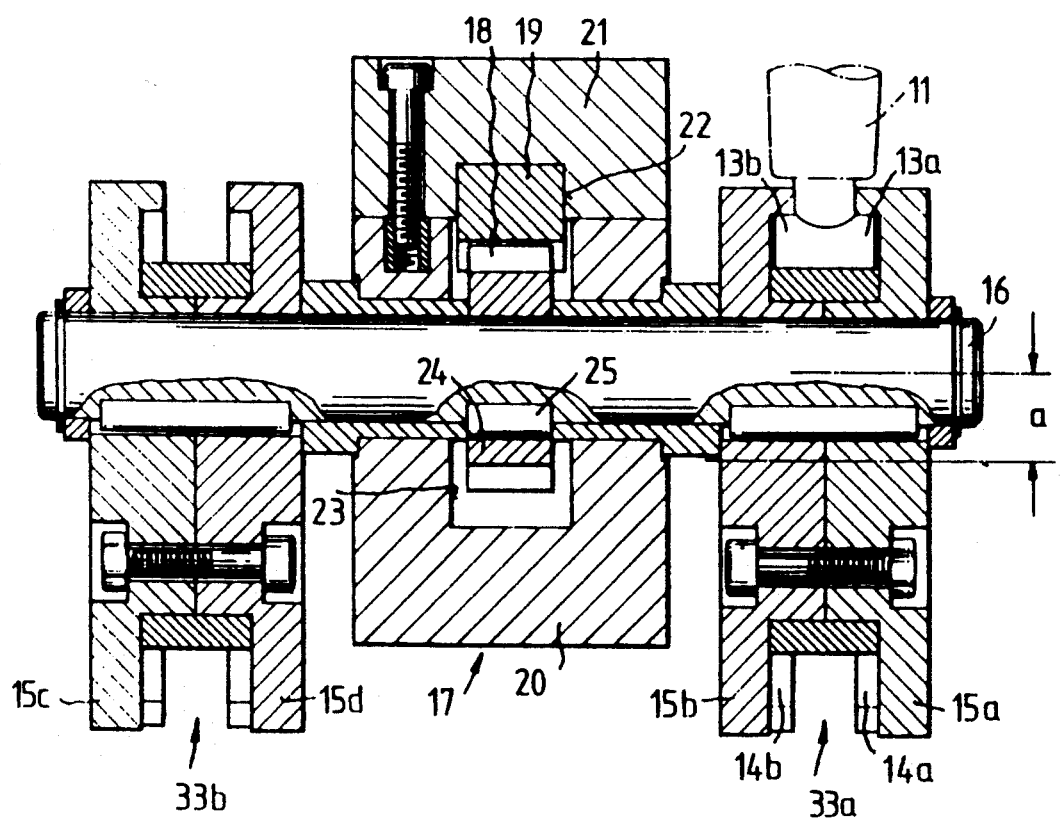
FIG. 4 is a sectional view taken transversely through the device for arresting the locking toggle according to lines S—S in FIG. 5a, FIGS. 5a and 5b are side views of the arresting device of FIG. 4.
Figure 6:
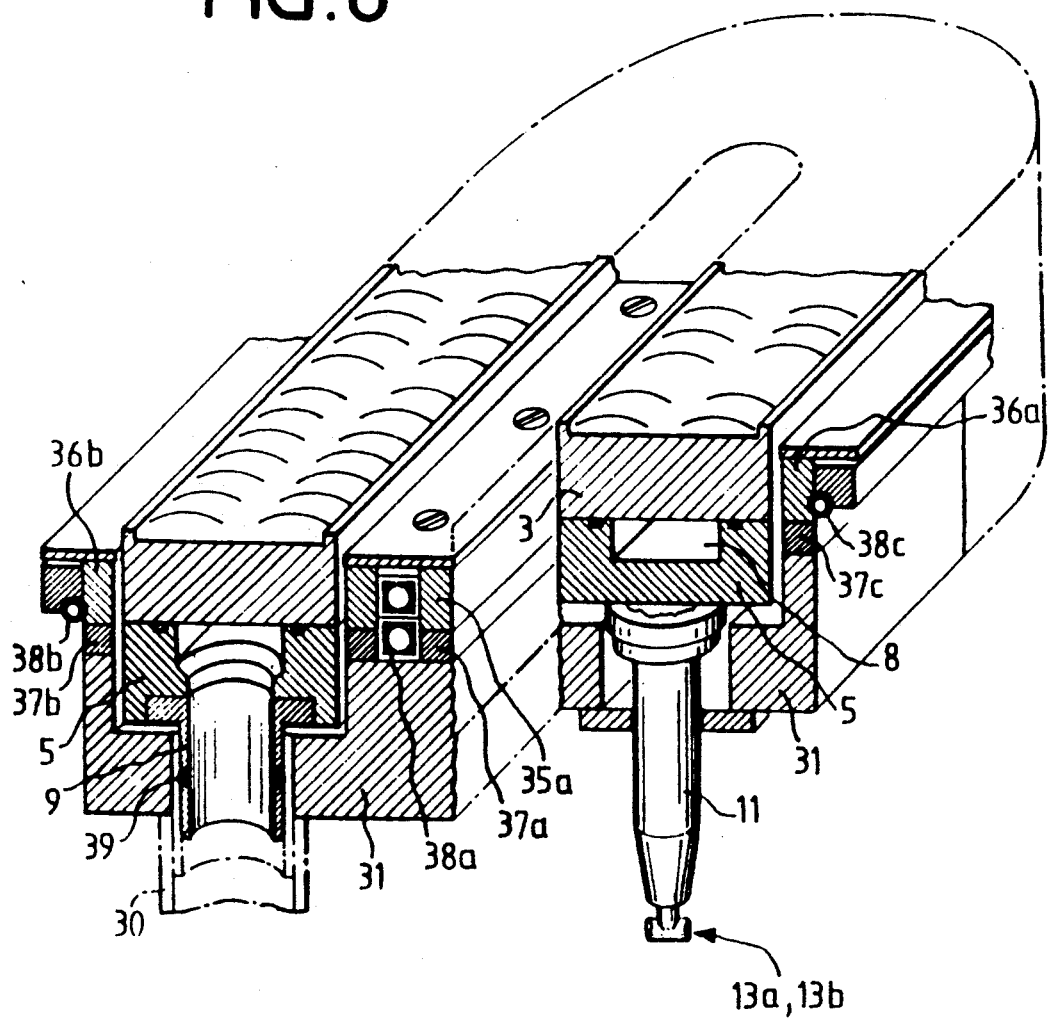
FIG. 6 is a perspective view of the subject of FIGS. 1 to 3, greatly simplified and on a smaller scale.

Each of the two locking shafts 16 and 16' are joined by keys 25 to a gear 24 (FIG. 4). The rack 19 has a cross groove 26 which is engaged with a nut 27 which in turn is threaded onto the spindle 28 which can be rotated by means of the hand crank 29. As it is easily apparent (FIGS. 5a, 5b), the rack 19 shifts in the direction of arrows A or B (depending on the direction of rotation) when the hand crank 29 is turned, and drives the two locking shafts 16, 16', accordingly.

Figure 2:
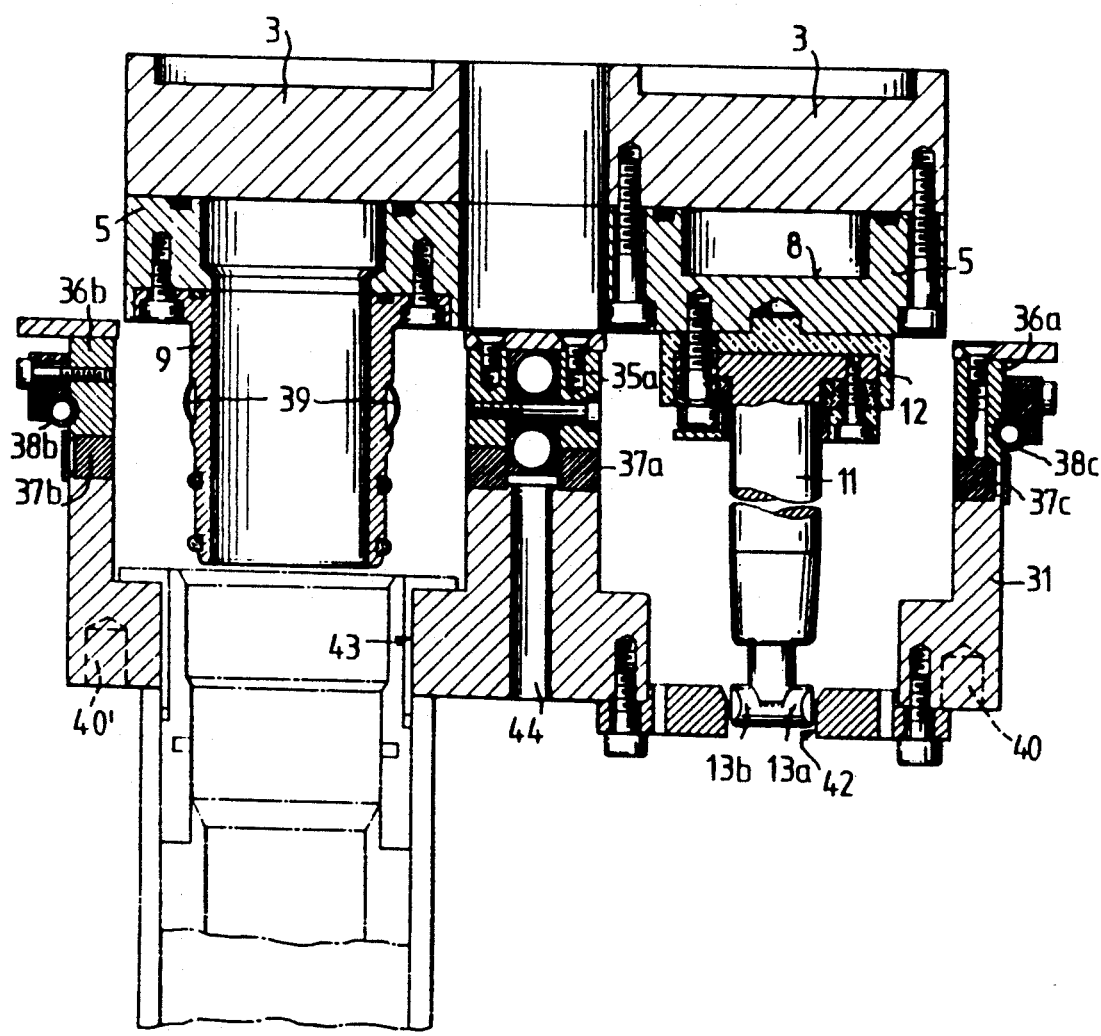
FIG. 2 is a sectional view of the target and the target base of FIG. 1 immediately before insertion into the magnet yoke, which is provided with a coolant connecting line, FIG. 3
Figure 3:
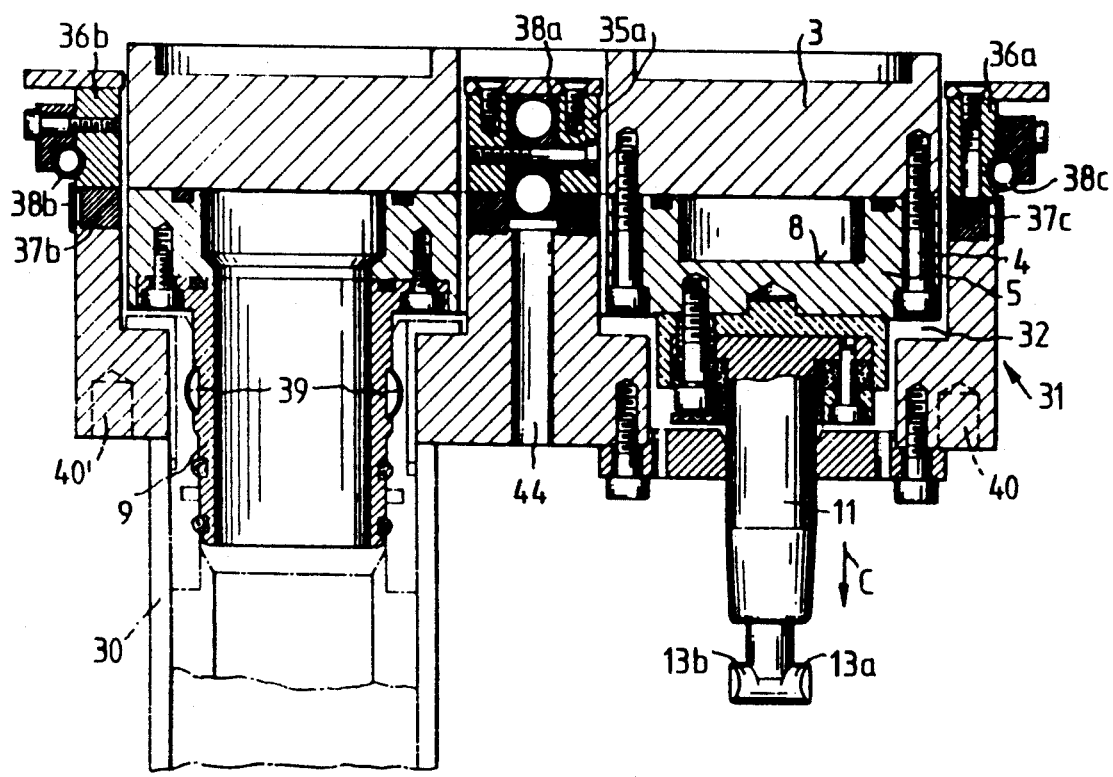
FIG. 3 is a sectional view of the target arrangement according to FIGS. 1 and 2, but with the target base fully inserted into the magnet yoke.

When the target 3 with target base 5 and locking toggles 11 is lowered in the direction of arrow C to such an extent that, as seen in FIG. 3, the coolant connection 9 enters into the coolant tube 30 of the magnet yoke 31 and the target base 5 completely fills the corresponding recess 32, then the locking projections 13, 13b, extending through openings 42, 43 (FIG. 2) engage (as shown in FIG. 4) the arcuate locking grooves 14a, 14b, through their entry openings 33a, . . . .

If now the spindle 28 is rotated by the hand crank 29, then the rack 19 shifts accordingly, turning the locking disks 15a, 15b, so that simultaneously the locking toggles 11, . . . , are drawn into the locking grooves 14a, 14b, . . . , and thus arrest the magnetic yoke 31 against displacement.

The locking grooves 14a, . . . , in the locking disks 15a, . . . , have for this purpose entry openings 33a, 33b, . . . , extending from the outside radially inwardly, whose width is made such that the locking projections 13a, 13b, . . . , diametrically opposite one another on each locking toggle 11, . . . , can be threaded into the tracks formed by the locking grooves 14a, 14b, . . . , in order then, by rotation of the locking disks 15a, 15b, . . . , to produce a lowering of the target 3 with its target base 5. To permit this pulling of the target 3 with its target base 5 into the working position, in the embodiment represented, the bores in the locking disks 15a, 15b, . . . , through which the locking shafts 16, 16', are passed, are provided off-center, such that the greatest offset a is in each case precisely opposite the particular entry opening 33a, . . . .

As FIG. 2 shows, the coolant connection 9 is provided with an electrical contact ring 39, so that electrical power can also be fed to the target base through the tube 30. The terminals are marked 35a, 35b and 36a, 36b, respectively, and the permanent magnets are marked 37a, . . . . Lastly, additional coolant water lines 38a, . . . are provided, which can be supplied through the connecting bore 44 or correspond with the latter.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Device for the releasable fastening of a target base together with a magnet yoke on a cathode mounting of a process chamber in a cathode sputtering apparatus, comprising: a magnet yoke having a bottom, a target base having at least one locking toggle extending perpendicular to a target plane, the toggle being carried through an opening in the bottom of the magnet yoke, a cathode mounting or arresting device, at least one locking disk journaled for rotation on the cathode mounting or arresting device, and the locking disk pulling the target base tightly onto the cathode mounting and releasing the locking toggle, so that the target base is removable from the cathode mounting.

2. Device according to claim 1, in which each locking toggle fastened to the target base has a longitudinal axis and has projections extending transversely of its longitudinal axis, and in which each locking disk has a cam track or locking groove, and which device includes a crank drive for rotating each locking disk and which device includes at least one shaft extending transversely of the longitudinal axis of the locking toggle and to which each locking disk is connected.

3. Device according to claim 2, in which the arresting device has a rack which is held and guided longitudinally displaceably in a plane parallel to the target plane, and which acts on the at least one shaft which is mounted in the arresting device such that a longitudinal displacement of the rack produces a synchronous rotation of the at least one shaft and each locking disk connected therewith.

4. Device according to claim 3, in which each locking disk disposed rotationally on the shafts is fastened in pairs and on both sides of the arresting device at both ends of each shaft, each disk being provided on its one lateral surface with a locking groove cooperating with one of the locking projections.

5. Device according to claim 4, in which each disk has an inlet opening which permits the radial entry and exit of associated locking projections of the locking toggle into the corresponding locking groove.

6. Device according to claim 5, in which each locking disk is shaped as a circular cylinder in whose one disk-shaped side face an arcuate, central locking groove is cut, a bore being provided off-center for the accommodation of the shaft, and a groove being cut, of equal depth and width corresponding with the locking groove and extending radially, which permits the entry of an associated locking projection into the arcuate groove.

7. Device according to claim 1, in which each locking toggle is fixedly joined to the target base, and which device includes cooling a passage in communication with coolant connections whose longitudinal axes are parallel to the longitudinal axis of the locking toggle, in which the magnet yoke has openings which correspond to the coolant connections which in turn are connected to coolant inlet and outlet lines.

* * * * *